US005974378A

United States Patent [19]
LeBlanc et al.

[11] Patent Number: 5,974,378
[45] Date of Patent: Oct. 26, 1999

[54] MULTI-STAGE VECTOR QUANTIZATION WITH EFFICIENT CODEBOOK SEARCH

[75] Inventors: Wilfrid P. LeBlanc, Vancouver, Canada; Alan V. McCree, Dallas, Tex.

[73] Assignee: Texas Instruments Incorporated, Dallas, Tex.

[21] Appl. No.: 09/003,172

[22] Filed: Jan. 6, 1998

Related U.S. Application Data

[60] Provisional application No. 60/035,764, Jan. 6, 1997.
[51] Int. Cl.⁶ ........................................................ G10L 9/00
[52] U.S. Cl. .......................................... 704/222; 704/230
[58] Field of Search ...................................... 704/222, 230

[56] References Cited

U.S. PATENT DOCUMENTS

| | | | |
|---|---|---|---|
| 5,398,069 | 3/1995 | Huang et al. | 348/422 |
| 5,774,839 | 6/1998 | Shlomot | 704/222 |

OTHER PUBLICATIONS

W.P. LeBlanc, B. Bhattacharya, S.A. Mahmoud and V. Cuperman, "Efficient Search and Design Procedures for Robust Multi–Stage VQ of LPC Parameters for 4 kb/s Speech Coding", *IEEE* (Oct. 1993).

*Primary Examiner*—David R. Hudspeth
*Assistant Examiner*—Abul K. Azad
*Attorney, Agent, or Firm*—Robert L. Troike; Richard L. Donaldson

[57] ABSTRACT

A method of using a computer (11) to perform a multi-stage vector quantization process (13*a*). At each stage of the process (13*a*) subsequent to the first stage, input vectors from the previous stage are used to search a codebook (13*b*) for code-vectors that minimize distortion. (FIG. 2) The search is structured so that each stage is performed with an outer loop that calculates components of distortion that do not depend on the input vector value. An inner loop, which does depend on input vector values, is used to calculate distortion values and to maintain a list of the current best output code-vectors. (FIG. 3). The first stage is a special case, having only one input vector, but is otherwise performed like the subsequent stages.

15 Claims, 2 Drawing Sheets

FIG. 3

RECEIVE INPUT VECTOR(s)
FOR s = 0 TO S - 1 (ALL STAGES)

INITIALIZE M BEST
INITIALIZE M BEST DISTORTION VALUES
DETERMINE d_max

OUTER LOOP {
    FOR $\ell$ = 1 TO L(s) - 1 (FOR EACH LEVEL OF A STAGE)

COMPUTE DISTORTION COMPONENTS THAT ARE INDEPENDENT OF INPUT VECTORS

INNER LOOP {
        FOR EACH M BEST

COMPUTE d FOR CODE-VECTOR AT EACH LEVEL, USING VALUES FROM OUTER LOOP

IF d ≤ d_max

DESIGNATE CODE-VECTOR AS NEW BEST M AND UPDATE d_max
    }
}

USE M BEST FOR INPUT TO NEXT STAGE

FOR s = S - 1 (FINAL STAGE)
FIND BEST OF M BEST

MULTI-STAGE VECTOR QUANTIZATION WITH EFFICIENT CODEBOOK SEARCH

This application claims priority under 35 USC § 119 (e)(1) of provisional application Ser. No. 60/035,764, filed Jan. 6, 1997

TECHNICAL FIELD OF THE INVENTION

The present invention relates to signal processing, and more particularly to a method of quantizing a vector of input data values using multi-stage vector quantization.

BACKGROUND OF THE INVENTION

Quantization is the process of converting input values into discrete values in accordance with some fidelity criterion. A typical example of quantization is the conversion of a continuous amplitude signal into discrete amplitude values. The signal is first sampled, then quantized.

For quantization, a range of expected values of the input signal is divided into a series of subranges. Each subrange has an associated quantization level. For example, for quantization to 8-bit values, there would be 256 levels. A sample value of the input signal that is within a certain subrange is converted to the associated quantizing level. For example, for 8-bit quantization, a sample of the input signal would be converted to one of 256 levels, each level represented by an 8-bit value.

Vector quantization is a method of quantization, which is based on the linear and non-linear correlation between samples and the shape of the probability distribution. Essentially, vector quantization is a lookup process, where the lookup table is referred to as a "codebook". The codebook lists each quantization level, and each level has an associated "code-vector". The vector quantization process compares an input vector to the code-vectors and determines the best code-vector in terms of minimum distortion. Where x is the input vector, the comparison of distortion values may be expressed as:

$$d(x, y^{(j)}) \leq d(x, y^{(k)})$$

, for all j not equal to k. The codebook is represented by $y^{(j)}$, where $y^{(j)}$ is the jth code-vector, $0 \leq j \leq L$, and L is the number of levels in the codebook.

Multi-stage vector quantization is a type of vector quantization. This process obtains a central quantized vector (the output vector) by adding a number of quantized vectors. The output vector is sometimes referred to as a "reconstructed" vector. Each vector used in the reconstruction is from a different codebook, each codebook corresponding to a "stage" of the quantization process. Each codebook is designed especially for a stage of the search. An input vector is quantized with the first codebook, and that value is quantized with the second codebook, etc. The set of vectors used in the reconstruction may be expressed as:

$$y^{(j_0, j_1, \ldots j_{S-1})} = y_0^{(j_0)} + y_1^{(j_1)} + y_{S-1}^{(j_{S-1})}$$

, where S is the number of stages and $y_s$ is the codebook for the sth stage. For example, for a three-dimensional input vector, such as x=(2,3,4), the reconstruction vectors for a two-stage search might be $y_0$=(1,2,3) and $y_1$=(1,1,1) (a perfect quantization and not always the case).

During multi-stage vector quantization, the codebooks may be searched using a sub-optimal tree search algorithm, also known as an M-algorithm. At each stage, M number of "best" code-vectors are passed from one stage to the next. The "best" code-vectors are selected in terms of minimum distortion. The search continues until the final stage, when only one best code-vector is determined.

SUMMARY OF THE INVENTION

The following description is directed to an improved method of using a computer to perform a multi-stage vector quantization search. Each stage searches a codebook having a number of quantization levels and a code-vector associated with each level. The first stage is a special case because there is only one input vector, e.g., the "target vector". Subsequent stages receive M input vectors, which are determined during a previous state. These input vectors may be "error vectors", representing the a sum of vectors determined during prior stages, which avoids the need to recalculate a sum.

Each stage is performed by initializing M best code-vectors to be determined during that current stage, and initializing a maximum distortion value of these M best code-vectors. This may be accomplished by using the input vectors and the code-vectors at the first level to calculate a distortion value and determining the "worst of the best" of these distortion values. Next, an outer loop is performed, whereby, for each level of the codebook, components of a distortion calculation not dependent on said input vectors are calculated. Then, an inner loop is performed, whereby, for each input vector, a current distortion value at each level is calculated. During the inner loop, the M best code-vectors are continually updated by comparing the current distortion value to the maximum distortion value and updating the maximum distortion value for each new M best code-vector. Where the input vectors are error vectors, the M best code-vectors from the current stage are added to the existing error vectors to provide input vectors for the next stage.

The above-described method can be modified so as to limit the number of calculations if the search becomes too complicated. Essentially, a limit is set on the number of times that the maximum distortion value is updated. If this limit is reached, the search is converted to a single best candidate search. This limit can be used regardless of whether an outer loop is performed over each level and an inner loop over each input vector, or vice versa.

An advantage of the invention is that the multi-stage vector quantization search is less complex, requiring fewer numerical calculations. The search can also be made efficient in terms of memory usage.

BRIEF DESCRIPTION OF THE DRAWINGS

FIG. 3 illustrates the process of FIG. 2 in further detail for execution by the computer system of FIG. 1.

DETAILED DESCRIPTION OF THE INVENTION

The following invention is directed to an improved method of performing a multi-stage vector quantization (MSVQ) search. A discussion of MSVQ, without the features of the invention, is set out in an article by LeBlanc, et al., "Efficient Search and Design Procedures for Robust Multi-Stage VQ of LPC Parameters for 4 kb/s Speech Encoding", *IEEE Transactions on Speech and Audio Processing*, Vol. 1, No. 4, pp. 373–385 (Oct. 1993). This article is incorporated herein by reference.

A typical application of MSVQ is in the field of speech encoding. A typical implementation of speech encoding is with real-time digital signal processors, such as the TMS320C30, manufactured by Texas Instruments Incorporated. These devices are used in equipment such as portable telephones and digital answering machines. However, the invention is not limited to speech encoding and could be used for any application of MSVQ.

Figure 1:
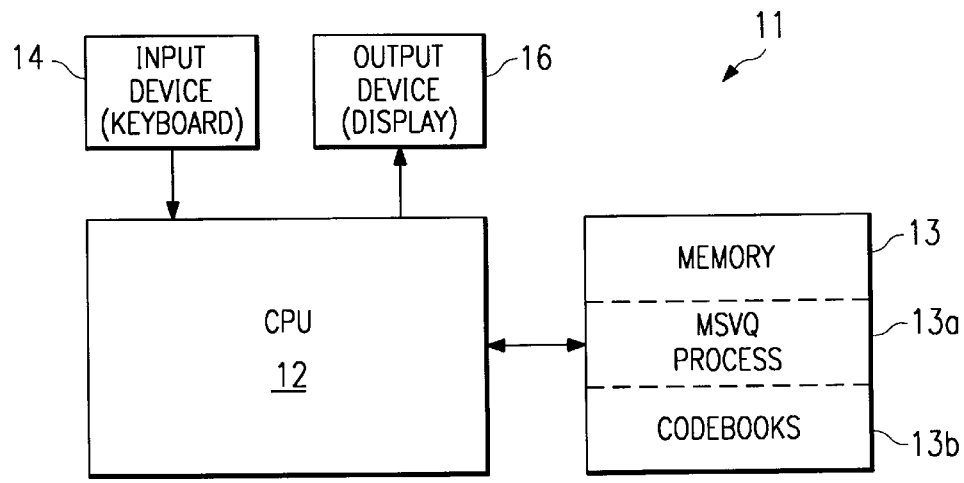
FIG. 1 illustrates a computer system programmed to perform multi-stage vector quantization in accordance with the invention.

FIG. 1 illustrates a computer system 11 programmed in accordance with the invention. As stated in the preceding paragraph, in alternative embodiments, a processor similarly programmed and performing a similar process as system 11, could be embedded in other equipment, without the input and output devices of FIG. 1.

Computer system 11 has a processing unit 12 with at least one processor, internal memory, and appropriate I/O (input/output) components. An example of a processing unit 12 is a personal computer, such as that manufactured by International Business Machines. A memory 13, such as a hard disk drive, stores programming executed by processing unit 12 and data operated on during program execution. An input device 14, such as a keyboard, is used to enter data. Other input devices could be used, such as voice recognition devices. Also, multiple input devices could be used, such as is usually the case when a trackball or other pointing device is used. An output device 15, such as a display, displays whatever user interface is appropriate for the data being entered, accessed, or operated on.

Memory 13 stores a MSVQ process 13a for execution by CPU 12. This process is implemented in accordance with the invention, and expressed with programming appropriate for CPU 12. Memory 13 also stores a number of codebooks 13b to be searched during the MSQV process, in the manner discussed below.

Figure 2:
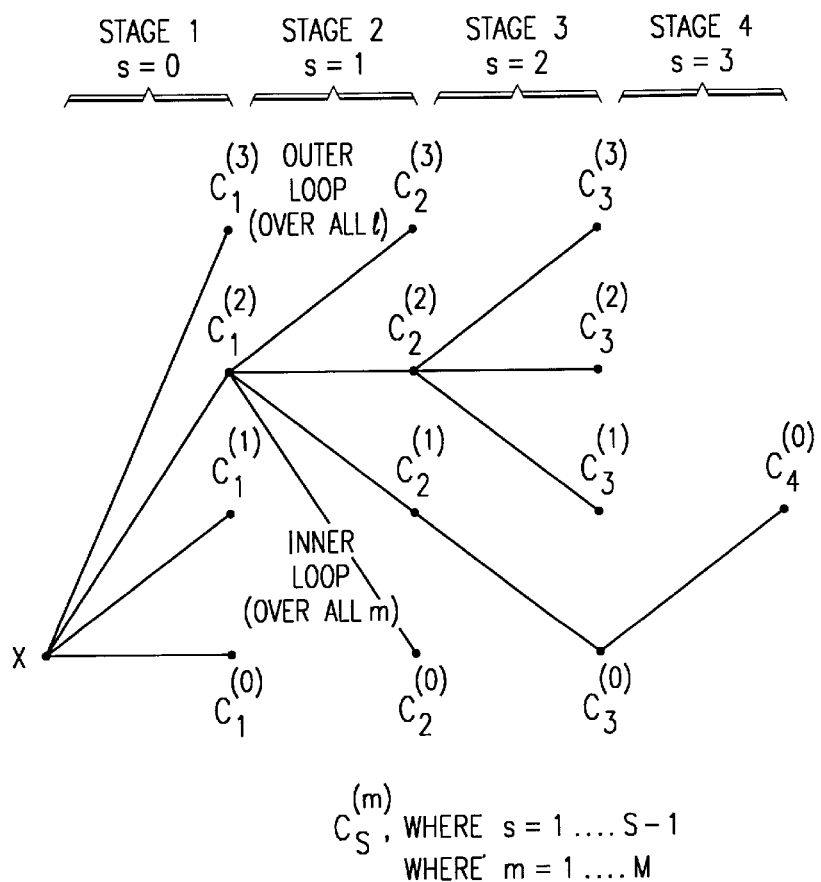
FIG. 2 illustrates the multi-stage vector quantization process in accordance with the invention.

FIG. 2 illustrates a MSVQ process in accordance with the invention. The input vector is identified as x. There are four stages. Thus, where S is the number of stages, S=4. Each stage has an associated codebook, $y_s$, for each sth stage. The codebooks at the various stages may have the same number of levels or the number of their levels may differ at one or more stages. Each codebook lists all quantization levels for that codebook and an associated code-vector for each level.

During each stage, each input vector (the first stage having only one input vector) is paired with each code-vector and a distortion calculation is made. In other words, the input vector(s) are evaluated in terms of distortion over all codebook levels. A number of code-vectors are selected as the best candidates from that stage, in terms of minimum distortion.

FIG. 2 illustrates only the code-vectors that are the best candidates from each stage. Where M is the number of best candidates selected from each stage, M=4. Each M best candidate is identified as $c_s^{(m)}$, where s identifies the stage, s=1 . . . S, and m identifies the mth best candidate, m=1 . . . M.

For purposes of the search, the output of a level is referred to as a "node". In FIG. 2, only four nodes at each stage, those associated with the M best candidates from that stage, are shown. At each stage, the output nodes of the prior stage become parent nodes to that stage.

FIG. 2 further illustrates, at each stage, the paths to the nodes of the M best candidates at that stage. This indicates that an M best candidate input to a stage is a sum of reconstruction vectors derived during prior stages. At the end of the final stage, the "best of the best" candidates is determined, and is a sum of four reconstruction vectors. This sum is a vector that is the best approximation to the input vector, x.

FIG. 3 is a flowchart of an implementation of the MSVQ process of FIG. 2. The process is appropriate for execution by computer system 11, having mathematical values expressed and indexed in a manner appropriate for computer processing. The Appendix sets out pseudo-code corresponding to the process of FIG. 3. The pseudo-code is consistent with the C programming language, but could be written in other programming languages.

Because the process is repetitive for stages, levels, and best candidates, the MSVQ process may be expressed in terms of "loops". As indicated in both FIGS. 2 and 3 and as explained below, the process loops through all stages. Within each stage, an "outer loop" calculates values that depend on the codebook level but not on the particular one of the M input vectors that is being evaluated. An "inner loop" evaluates the M input vectors against code-vectors at each level.

At the beginning of each stage, the M best candidates to be output from that stage are initialized. In the example of Appendix A, the input code-vector(s) are evaluated against the first level code-vector to obtain an initial M best candidates. This avoids any need to index or compute maxima for those code-vectors. After their distortion values are calculated from the first level code-vector, the search proceeds "down" all subsequent levels to the last level. Alternatively, distortion values for an initial M best could be calculated from the last level code-vector values and the search could proceed "up" to the first level. As a further alternative, a distortion value could be initialized at some very large value (i.e., an out of range value, such as infinity) and the first level code-vectors processed in the same "outer loop" as those at all other levels.

In the example of this description, the distortion calculations are weighted mean square calculations. The weighting matrix is a diagonal matrix. However, the invention is also useful for MSVQ processes with distortion calculations that use non-diagonal weighting matrices, as well as for unweighted distortion calculations.

Referring specifically to FIG. 3 and the Appendix, the search is initialized by setting a loop counter, which as explained below, is used to limit "worst case" searches. The input vector, x, is designated as an error vector for the parent node.

For the first stage, the initial M best code-vectors are designated by calculating a distortion value M times, using the first level code-vector. A node data structure is used to store parameters corresponding to these initial M best. The node data structure contains the distortion value and the index to the current level, and the node is designated as a parent node.

From the distortion values of the initial M best, the maximum distortion value is determined. This value, d_max, is maintained for use when determining the actual M best from the current stage.

Next, an "outer loop" over each level (other than the first level) is performed, where certain components of the distortion calculation are computed. These components are dependent on the code-vector values but not on the values of the input vectors. In the example of this description, distortion is based on weighted mean square calculations. As shown in the Appendix, a weighted vector value, yw, is computed, and then used to compute a squared weighted vector value, ysq.

Next, an inner loop is executed, during which distortion values are calculated and compared to d_max. For the first stage, this inner loop is only performed once because there is only one input vector, x.

During the first stage, codebook $y_0$ (with $L_0$ levels) is searched for code-vectors providing minimum distortion from the input vectors. The distortion calculations for the first stage are different from those of other stages because the first stage has only one input vector, x. At each level, a distortion value is computed as a squared and weighted sum of differences between the input vector and the code-vector at that level. Expressed mathematically, the distortion value, d, is computed as follows:

$$d_0^{(1)} = (x - y_0^{(1)})^T W(x - y_0^{(1)})$$
$$= \sum_{p-1}^{i=o} (x_i - y_{0,i}^{(l)})^2 W_{ii}$$

, where W is a diagonal weighting matrix. The vector transpose, represented by the T superscript, results in a summation when the weighting matrix is a diagonal matrix. The d value is a sum, over the number of vector dimensions, i, of squared difference values (x-y) times a weighting value, W. The superscript and subscript indices indicate the stage, level, and dimension of a particular value.

Thus, as illustrated in the Appendix, a distortion value, d, is calculated at each level, using the yw and ysq values calculated in the outer loop. The three terms of the calculation are equivalent to the three terms of the expanded distortion equation, where the transpose of the diagonal vector results in a sum. At each level, the distortion value, d, may be referred to as a "current node distortion value".

A section of the inner loop that designates each new M best is entered only when a current node distortion value is less than the current maximum distortion value. In other words, when d<d_max, the code-vector corresponding to that d value is designated as a new M best candidate. This conditional operation contains an "inner inner loop", where the index of the maximum of the minimum distortion values is updated.

After the actual M best code-vectors from the first stage are determined, an error vector is computed for each by adding the input vector to the code-vector. In other words, the vectors on a path are summed as illustrated in FIG. 2. This error vector, e, is included in the node data structure. It is this error vector that is passed to the next stage. Alternatively, the M best code-vectors could be passed to the next stage, and the sum of the path vectors maintained as a separate variable. The node of each of the M best is designated as a parent node for the next stage.

From the first stage, the node values for the M best code-vectors, including the distortion value and the error vector, are passed to the second stage.

Referring again to FIG. 2, these best M candidates from the first stage are denoted as $c_1^{(j)}$, for every $0 \leq j \leq M$. Where M=4, there are four code-vectors from the first stage.

The distortion calculations for the second stage (and all subsequent stages) use the M best code-vectors determined in the preceding stage. The distortion, d, is calculated as follows:

$$d_1^{(j,l)}=(x-c_1^{(j,l)}-y_1^{(j,l)})^T W(x-c_1^{(j,l)}-y_1^{(l)})$$

The search is performed over all of the input code-vectors, $0 \leq j \leq M$, and over all levels, $0 \leq l \leq L_1$.

From the preceding equation, an error vector may be expressed as follows:

$$e_k^{(j)}=x-c_k^{(j)}$$

, where $e_0^{(j)}=x$ for every j. This value avoids the need to maintain a sum. Therefore, at each stage k, the code-vectors are found that minimize distortion as follows:

$$d_k^{(j,l)} = (e_k^{(j)} - y_k^{(l)})^T W(e_k^{(j)} - y_k^{(l)})$$
$$= \sum_{i=0}^{p-1} (e_{k,i}^{(j)} - y_{k,i}^{(l)})^2 W_{ii}$$

, over all j and l.

If the preceding equation is expanded, it becomes:

$$d_k^{(j,l)}=d_k^{(j,l)}=e_k^{(j)T}We_k^{(j)}-2y_k^{(l)T}We_k^{(j)}+y_k^{(l)T}Wy_k^{(l)}$$

The expanded equation indicates that the first term is the distortion of a candidate from a previous stage and is therefore known. The final term is not a function of j and has terms in common with the second term. The second term can be computed as follows:

$$(y_k^{(l)T}W)e_k^{(j)}$$

As illustrated in FIG. 3 and as set out in the Appendix, the second stage begins by initializing the M best candidates to be output from that stage. These are the M input vectors evaluated against the first level code-vector. The outer loop is performed over all levels (other than the first level) to calculate values that depend on the code-vector at each level but not on an input vector. These values are the weighted vector value, yw, and the squared weighted vector values, ysq. Because there are M input vectors to this stage, the inner loop is performed over these M vectors. In this inner loop, the weighted vector values, squared weighted vector values, and error values from the preceding stage, are used to calculate distortion values, and the actual M best code-vectors are determined.

As illustrated in Appendix A, the inner loop can contain a limiting value so as to prevent "worst case" situations. As stated above, a conditional operation is performed when $d \leq d\_max$ and contains an "inner-inner loop" that updates the index of the maximum of the minimum distortion values. If the number of times that this conditional operation is performed exceeds the limiting value, the search continues with only a single best code-vector rather than M best.

The limiting value may be set so as to not substantially affect performance of the MSVQ search. For example, for a search with 64 level codebooks, 4 stages, and M=8, limiting the number of times the inner loop is entered to 200 does not substantially affect performance.

In the example of the Appendix, the limiting value is set in the inner loop. If the limiting value is reached, the value M is set to 1. The inner loop is permitted to finish for the current level. At the next level, Mx is set equal to the new M (which is now equal to 1), and the inner loop is performed only once for the code vector having the smallest distortion value. The rest of the search is performed with respect to only a single best candidate rather than M best.

Assuming that the limiting value was not reached, after the M best output vectors from the second stage are determined, their associated error vectors are calculated, and their nodes become the new parent nodes.

The new M best candidates from the second stage are the sum of the previous stage candidates and the "best" code-vectors found during the second stage search, that is, $c_1^{(j)}+y_1^{(l)}$, for the "best" values of j and l.

Referring to both FIGS. 2 and 3, each subsequent stage of the MSVQ process is performed like the second stage. At the final stage, the best candidate is chosen as the best quantized value.

In the process of FIG. 3 and the Appendix, during each stage, the M best candidates to be output from that stage are stored as an unsorted list. A variable identifying the "worst of the best" distortion, e.g., d_max, is maintained, as well as a pointer to the associated code-vector. When a new best candidate is found (a code-vector whose distortion value that is less than the "worst of the best"), the new best candidate replaces the "worst of the best" candidate in the list and a new "worst of the best" is determined. Because the list is unsorted, a search is performed to find the new maximum of minimum distortions. As an alternative, the "worst of the best" could be identified as being in a sorted list of the M candidates. Then if a new best candidate is found, it is placed in the proper location in the list. This can be accomplished with a tree sort or with some other appropriate sorting procedure.

Further simplification of the MSVQ process could be accomplished by treating the first and last stages as special cases. In the first stage, the first M code-vectors could be designated as the initial M best. In the final stage, the M best candidates do not have to be maintained for subsequent stages.

For the "reduced complexity" MSVQ process described above, the total complexity can be expressed in terms of the number of operations. Where p is the dimension of the vector, for a search of a codebook having L levels in each stage and M candidates passed between each stage, the complexity may be determined by the total number of calculations:

$$C = p(3L_0 + (L_1 + L_2 + \ldots)(M+2))$$

For example, in a codebook structure having 64 levels per stage, 4 stages, and 8 best candidates passed between stages, the complexity is:

$$C = p(3 \times 64 + 64 + 64 + 64)(8+2) = 2112p$$

The complexity of an MSVQ search in accordance with the invention, as calculated above, may be compared to the complexity of the "straightforward" search. For quantizing a vector of dimension p, each computation of d requires p operations for a differencing operation, p operations for a weighting operation, and p operations for multiplying the weighted vector by the vector resulting from the differencing operation. Thus, each computation of d requires 3p operations. A joint optimization over all m and l leads to a complexity of $L_0$ distortion computations for the first stage and approximately $ML_s$ distortion computations for each sth stage. The total search complexity can be expressed as:

$$C = 3p(L_0 + (L_1 + L_2 + \ldots)M)$$

For very large values of M, the reduced complexity method is a factor of 3 less complex than the straightforward method.

In FIG. 3 and Appendix A, for each stage, the outer loop is performed over l, the number of levels. The inner loop is performed over m, the number of input vectors. As an alternative to the implementation of FIG. 3, computation of $(y_k^{(l)T} W) e_k^{(l)}$ could be accomplished by an outer loop over m and an inner loop over l. However, these two variations differ in the memory space required. Performing the outer loop over l requires only p locations of memory to store $y_k^{(l)T} W$ for the current value of l. On the other hand, performing the outer loop over m requires $pL_k$ memory locations to store $y_k^{(l)T} W$ over all values of l.

If the outer loop is performed over m and the inner loop over l, the above-described method of avoiding worst case searches can be used in a similar manner. In general, regardless of the order of the inner and outer loops, as each input vector is being evaluated, a conditional operation is performed when $d \leq d\_max$. The number of times that this conditional operation is performed can be monitored and if a limit is reached, the search continues by comparing distortion values with respect to only a single code vector. The rest of the search is performed with only a single best code vector rather than M best.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

APPENDIX

```
/* Initialization: */
inner_loop_counter = MAX_INNER_LOOPS
m = 0 to M - 1:
Begin
    parent_node(m) .d = sum i = 0 to p - 1: x(i) ^ 2 w(i,i)
    parent_node(m) .e = x
End
/* Loop over all stages: */
over all s = 0 to S - 1
Begin
    /* start off the tree search with the M best */
    l = 0:
    Begin
        i = 0 to p - 1: yw(i) = y(s,l,i)*w(i,i)
        ysq = sum (yw(i))
        m = 0 to M - 1:
        Begin
            node(m) .d = parent_node(m) .d + ysq -
                2 sum i = 0 to p - 1: parent_node(m) .e(i)
                yw(i)
            node(m) .indices(s) = l
            node(m) .parent_node = m
        End
    End
    p_max = index of max of min distortions
    d_max = node(p_max) .d
    l = 1 to L(s) - 1:
    Begin
        /* compute weighted vector components outside
           of inner loop */
        i = 0 to p - 1: yw(i) = y(s,l,i) *w(i,i)
        ysq = sum i = 0 to p - 1: (yw(i)) ^ 2
        set Mx to 1 if s = 0, otherwise set Mx to M
        /* loop over all nodes */
        m = 0 to Mx - 1:
        Begin
            d = parent_node(m) .d + ysq -
                2 sum i = 0 to p - 1:
                parent_node(m) .e(i) yw(i)
            if (d <= d_max)
            Begin
                node(p_max) .= d;
                node(p_max) .indices(s) = l;
                node(p_max) .parent_node = m;
                p_max = index of max of min
                distortions;
                d_max = node(p_max) .d
                /* limit worst case complexity */
                inner_loop_counter =
                inner_loop_counter - 1
                if (inner_loop_counter <= 0)
                    set M = 1
            End
        End
    End
End
/* compute the error vectors for each node */
```

APPENDIX

```
m = 0 to M - 1:
Begin
    i - 0 to p - 1:
    Begin
        node(m) .e(i) = parent node (node(m).
            parent) .e(i) + y(s,node(m).
            indices(s)), i)
    End
    i = 0 to s - 1:
    Begin
        node(m) .indices(i) = parent_node
        (node(m) .parent) .indices(i)
    End
End
/* swap parent nodes to current nodes */
swap (parent_node,node);
End
/* find best set of indices */
best = 0
m = 1 to M - 1:
Begin
    Set best = m if parent_nodes[m] .d <
        parent_nodes[best] .d
End
/* best set of indices is parent_nodes[best] .indices */
return parent_nodes[best] .indices
```

What is claimed is:

1. A method of using a computer to perform a current stage of a multi-stage vector quantization search of a codebook having a number of quantization levels and a codevector associated with each level, comprising the steps of:

receiving M input vectors determined by a previous stage;

initializing M best code-vectors to be determined during said current stage;

initializing a maximum distortion value of said M best code-vectors;

performing an outer loop whereby, for each level of said codebook, components of a distortion calculation not dependent on said input vectors are calculated;

performing an inner loop whereby, for each of said input vectors, a node distortion value is calculated, and M best code-vectors are continually updated by comparing said current distortion value to said maximum distortion value and updating said maximum distortion value for each new M best code-vector; and limiting the number of times said inner loop is performed.

2. The method of claim 1, wherein said input vectors are error vectors and further comprising the step of calculating error vectors for each of said M best code-vectors by adding an M best code-vector to an associated input vector.

3. The method of claim 1, wherein said input vectors are error vectors and said step of performing an inner loop is performed such that a component of each said node distortion value is one of said error vectors.

4. The method of claim 1, wherein said input vectors are the M best code-vectors from a previous stage and further comprising the step of maintaining a sum of M best code-vectors from all preceding stages.

5. The method of claim 1, wherein said step of initializing said maximum distortion value is performed by calculating distortion values at the first level of said codebook and wherein said outer loop is performed for each level except said first level.

6. The method of claim 1, wherein said step of initializing said maximum distortion value is performed by calculating distortion values at the last level of said codebook and wherein said outer loop is performed for each level except said last level.

7. The method of claim 1, wherein said step of initializing said maximum distortion value is performed by assigned an out of range value to said maximum distortion value.

8. The method of claim 1, wherein said step of performing an inner loop is performed such that each said node distortion value is obtained with mean squared calculations and wherein said step of performing an outer loop is performed by calculating a sum of squares value.

9. The method of claim 8, wherein each said node distortion value is obtained with weighted mean squared calculations and wherein said step of performing an outer loop is performed by calculating a weighted vector value and a weighted sum of squares value.

10. The method of claim 1, wherein said M best output code-vectors are stored in a sorted list, such that said step of updating said maximum distortion value is performed by identifying a location in said list, and wherein said step of performing an inner loop updates said maximum distortion value by resorting said list.

11. The method of claim 1, wherein said M best output code-vectors are stored in an unsorted list, such that said step of identifying a maximum distortion value is performed by assigning a value to a variable, and wherein said step of performing an inner loop updates said maximum distortion value by reassigning a value to said variable.

12. A method of using a computer to perform a current stage of a multi-stage vector quantization search of a codebook having a number of quantization levels and a codevector associated with each level, comprising the steps of:

receiving M input vectors determined by a previous stage;

initializing M best code-vectors to be determined during said current stage;

initializing a maximum distortion value of said M best code-vectors; and for each of said input vectors at each of said levels, calculating a node distortion value, such that M best code-vectors are continually updated by comparing said current distortion value to said maximum distortion value and updating said maximum distortion value for each new M best code-vector;

wherein said calculating step is limited such that if a predetermined number of operations has been performed, said calculating step is performed by updating only one of said M best code vectors for all subsequent input vectors at all subsequent levels.

13. The method of claim 12, wherein said calculating step is performed with an outer loop over the number of levels and an inner loop over the number of input vectors.

14. The method of claim 13, wherein said calculating step is performed with an outer loop over the number of input vectors and an inner loop over the number of levels.

15. The method of claim 12, wherein said predetermined number of operations is the number of operations performed when said current distortion value is less than or equal to said maximum distortion value.

* * * * *